United States Patent
Minami et al.

(10) Patent No.: US 8,324,708 B2
(45) Date of Patent: Dec. 4, 2012

(54) SEMICONDUCTOR INTEGRATED CIRCUIT DEVICE AND MANUFACTURING METHOD THEREOF

(75) Inventors: Yukimasa Minami, Chiba (JP); Masaru Akino, Chiba (JP)

(73) Assignee: Seiko Instruments Inc., Chiba (JP)

( * ) Notice: Subject to any disclaimer, the term of this patent is extended or adjusted under 35 U.S.C. 154(b) by 98 days.

(21) Appl. No.: 12/888,183

(22) Filed: Sep. 22, 2010

(65) Prior Publication Data

US 2011/0073986 A1    Mar. 31, 2011

(30) Foreign Application Priority Data

Sep. 25, 2009    (JP) .................................. 2009-221238

(51) Int. Cl.
*H01L 29/00* (2006.01)

(52) U.S. Cl. ................. 257/529; 257/530; 257/E23.147

(58) Field of Classification Search .................. 257/209, 257/529, 530, 531, E23.147, E23.149
See application file for complete search history.

(56) References Cited

U.S. PATENT DOCUMENTS

2010/0117191 A1*    5/2010    Oshida et al. ................. 257/529

FOREIGN PATENT DOCUMENTS

| JP | 05-021605 A | 1/1993 |
| JP | 07-022508 A | 1/1995 |

* cited by examiner

*Primary Examiner* — Hoai V Pham (74) *Attorney, Agent, or Firm* — Brinks Hofer Gilson & Lione (57) ABSTRACT

Provided is a semiconductor integrated circuit device including fuse elements for carrying out laser trimming processing, in which a space width between aluminum interconnects of the first layer to be connected to the adjacent fuse elements is set to less than twice of the thickness of the side wall of the metal interlayer insulating film of the first layer, thereby preventing exposure of the SOG layer having hygroscopic property. In addition, side spacers are provided to side surfaces of the aluminum interconnects of the first layer.

3 Claims, 6 Drawing Sheets

SEMICONDUCTOR INTEGRATED CIRCUIT DEVICE AND MANUFACTURING METHOD THEREOF

RELATED APPLICATIONS

This application claims priority under 35 U.S.C. §119 to Japanese Patent Application No. 2009-221238 filed on Sep. 25, 2009, the entire content of which is hereby incorporated by reference.

BACKGROUND OF THE INVENTION

1. Field of the Invention

The present invention relates to a semiconductor integrated circuit device having fuse elements and a manufacturing method thereof.

2. Description of the Related Art

Voltage regulators and voltage detectors each include an analog processing circuit, a logic circuit, a capacitor, a bleeder resistor, and the like. In a part of the bleeder resistor, fuse elements are formed and disposed for selecting resistors to obtain a desired voltage by adjustment in an inspection step.

Figure 5:
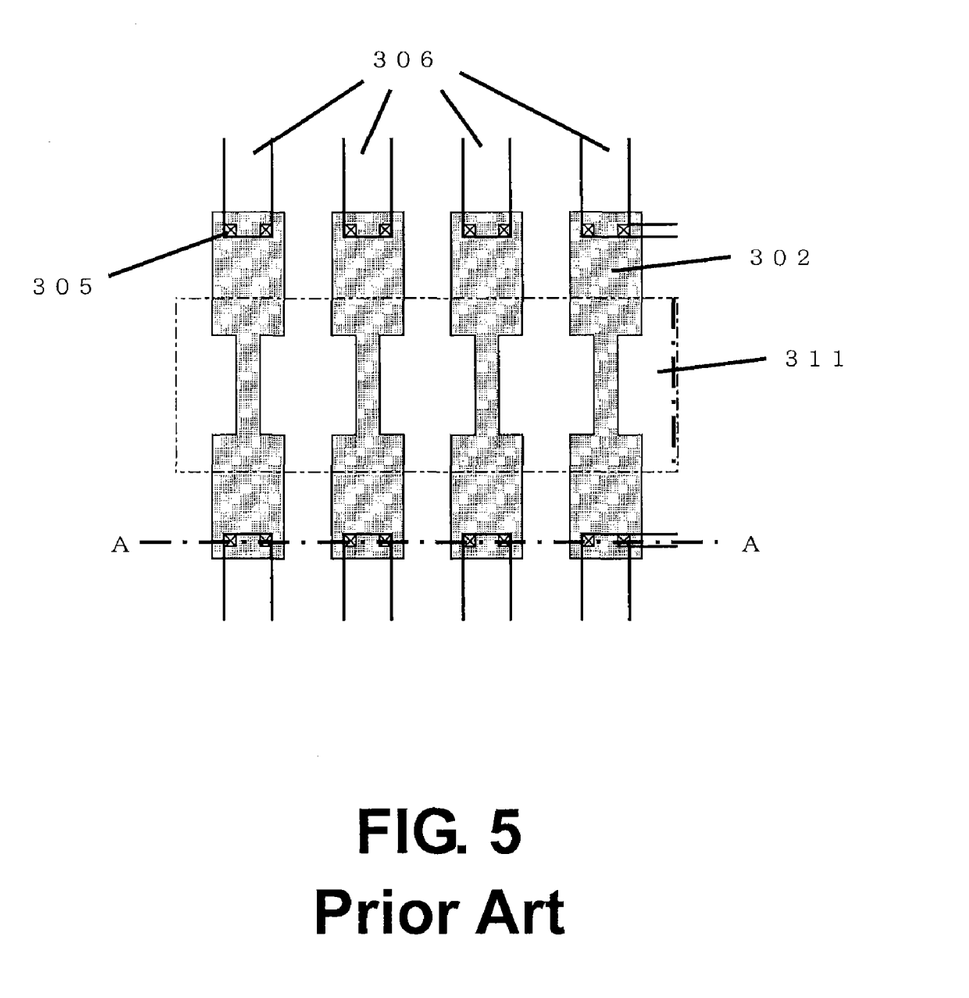
FIG. 5 is schematic top view of a conventional semiconductor integrated circuit device.
Figure 6:
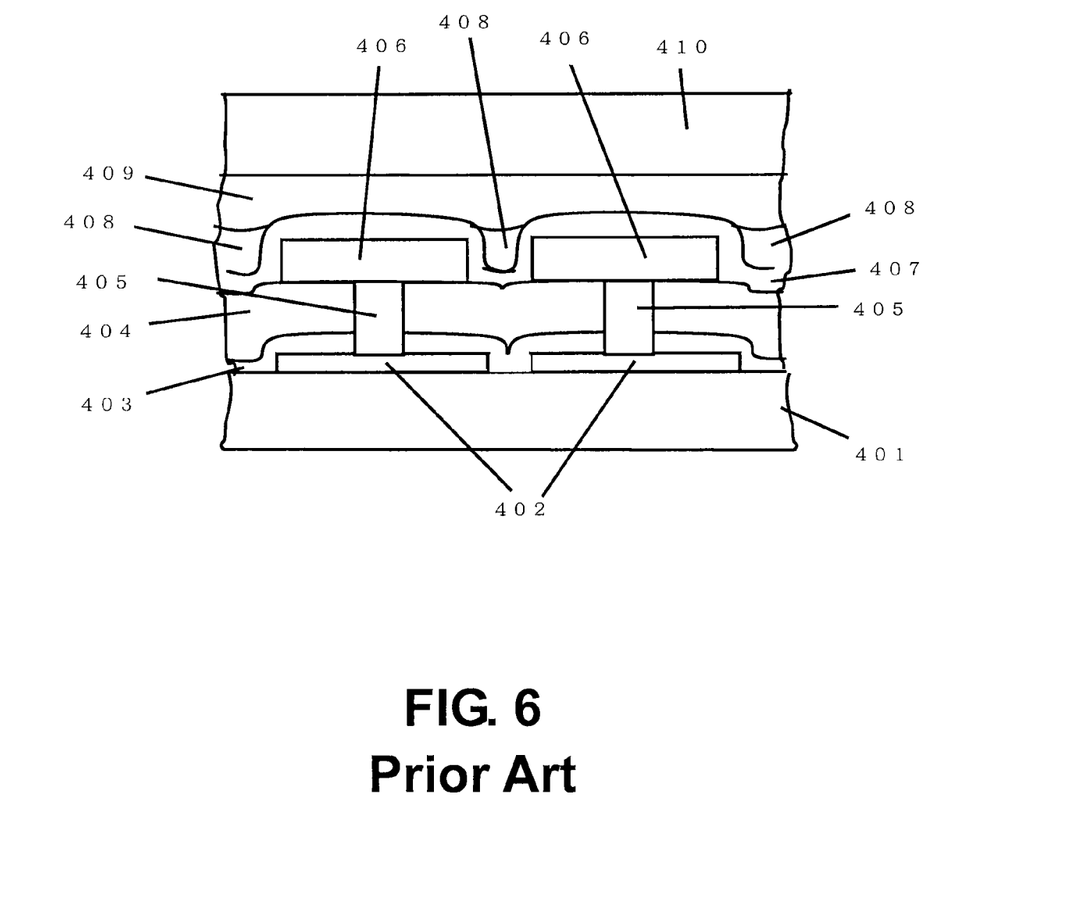
FIG. 6 is a schematic sectional view taken along the A-A line of the conventional semiconductor integrated circuit device of FIG. 5.

FIG. 5 and FIG. 6 illustrate a conventional example of a semiconductor integrated circuit having such a structure. FIG. 5 is a top view of the fuse elements, and FIG. 6 is a sectional view taken along the line A-A of FIG. 5. As illustrated in FIG. 6, the fuse elements are formed on an element isolation insulating film 401 with the same conductive material as a gate electrode of a MOSFET, in other words, by polycide films 402 (corresponding to reference numeral 302 of FIG. 5) formed of a polycrystalline Si film and a WSix film doped with impurities.

The polycide films 402 are covered with an interlayer insulating film 403 and a BPSG film 404, which being a flattering film. Contact holes 405 (corresponding to reference numeral 305 of FIG. 5) reaching to vicinities of both end portions of the polycide films 402 are opened within the BPSG film 404 and the interlayer insulating film 403. On the BPSG film 404, interconnects formed of an aluminum film 406 (corresponding to reference numeral 306 of FIG. 5) of a first layer are patterned so that the interconnects are brought into contact with the polycide films 402 through the contact hole 405. The aluminum films 406 are covered with a metal interlayer insulating film 407 of a first layer made from TEOS as a raw material by plasma CVD.

Although not illustrated, in the above-mentioned conventional example, an aluminum film of a second layer is also used in addition to the aluminum film of the first layer. Accordingly, as a flattening film between those aluminum films, an SOG film 408 is formed on the metal interlayer insulating film 407 of the first layer by rotation coating, curing, and etch-back thereafter. The SOG film 408 are covered with the metal interlayer insulating film 409 of the second layer, which is made from TEOS as a raw material by plasma CVD. The metal interlayer insulating film 409 of the second layer is covered with an SiN film 410, which is an overcoat film formed by plasma CVD.

Besides, opening regions 311 are formed on the polycide films 402 for cutting the polycide films 402, which are the fuse elements, with a laser beam. The opening regions 311 are formed by etching using the same mask used for etching the SiN film 410 on an aluminum pad (not shown) at the same time. However, due to over etching, the opening regions 311 reach to the metal interlayer insulating film 409 of the second layer.

Japanese Patent Application Laid-open No. 05-021695 suggests, in addition to such structure described above, a structure, by which cracks or peeling of an SiN film, or the like may be prevented from occurring.

Further, Japanese Patent Application Laid-open No. 07-022508 suggests a structure in which a guard ring layer is provided at surroundings of the fuse elements, whereby entry of a foreign matter or water may be prevented.

In the voltage regulators and the voltage detectors, an operation test is conducted in a wafer state after the formation of the elements, and simultaneously corresponding fuse element of the resistor is cut to obtain a desired voltage.

In this regard, as is apparent from FIG. 5 and FIG. 6, the SOG films 408 are exposed to inner side surfaces of the opening regions 311 for trimming processing of the fuse elements, in particular, between the aluminum interconnects connected to the adjacent fuse elements. However, each of the SOG films 408 has such a nature as being likely to absorb water. For that reason, water or moisture entered from an outside is contaminated into internal elements of the semiconductor integrated circuit through the SOG film 408, resulting in a cause of a reliability failure of a semiconductor integrated circuit device.

SUMMARY OF THE INVENTION

The present invention has been made in view of the above-mentioned problems, and it is an object of the present invention to provide a semiconductor integrated circuit device, in which an improvement is made of a structure of a metal interlayer insulating film having multi layer interconnects so that inside surfaces of opening regions 311, in particular, SOG films 408, which are exposed to the inside surfaces of the opening regions 311 between the aluminum interconnects of adjacent fuse elements, are segmented to prevent moisture from entering into internal elements of the semiconductor integrated circuit device, thereby attaining an enhancement of its reliability.

In order to solve the above-mentioned problems, the present invention takes the following measures.

First, there is provided a semiconductor integrated circuit device, including:

an element isolation insulating film disposed on a semiconductor substrate;

fuse elements disposed on the element isolation insulating film;

an insulating film disposed on the fuse elements;

first interconnects to be connected to the fuse elements via contact holes formed in the insulating form;

a second interconnect disposed above the first interconnect via a first metal interlayer insulating film, an SOG film and a second metal interlayer insulating film;

in which a space width between the first interconnects to be connected to the adjacent fuse elements is less than twice of a thickness of a side wall of the first metal interlayer insulating film.

Further, there is provided a semiconductor integrated circuit device, further including side spacers provided at side surfaces of the first interconnect, in which the first metal interlayer insulating film is formed so as to cover the first interconnect and the side spacers.

Still further, there is provided a semiconductor integrated circuit device, in which each of the side spacers includes one member selected from the group consisting of: an oxide silicon film; a phosphor silica glass (PSG) film; and a nitride silicon film.

In addition, there is provided a method of manufacturing a semiconductor integrated circuit device, comprising:

forming an element isolation insulating film on a semiconductor substrate;

forming fuse elements on the element isolation insulating film;

forming an insulating film on the fuse elements;

forming first interconnects to be connected to the fuse elements via contact holes formed in the insulating form so that a space width between the first interconnects to be connected to the adjacent fuse elements is set to less than two times of a thickness of a side wall of the insulating film;

forming side spacers at side surfaces of the first interconnect;

forming a first metal interlayer insulating film so as to cover the first interconnect and the side spacers;

forming the first metal interlayer insulating film, SOG films, and a second metal interlayer insulating film between the first interconnect and a second interconnect the layer formed above the first interconnect; and forming opening regions in a protective film above the fuse elements.

In the semiconductor integrated circuit device of the present invention, it is configured so that the width between the aluminum interconnects of the adjacent fuse elements is less than two times of the thickness of the side wall of the metal interlayer insulating film of the first layer. Alternatively, the side spaces are provided to the side surfaces of the interconnect to be connected to the fuse elements, and hence there is no space for the SOG films to be left between the aluminum interconnects. As a result, the SOG films are removed during an in-process, and the SOG films are interrupted between the aluminum interconnects of the adjacent fuse elements. Therefore, the moisture absorbed from the SOG films are dammed by the interrupted portions, resulting in no entry of the moisture into an internal element of the semiconductor integrated circuit. Consequently, the reliability of the semiconductor integrated circuit may be enhanced.

DETAILED DESCRIPTION OF THE PREFERRED EMBODIMENTS

Hereinafter, embodiments of the present invention are described with reference to the drawings.

Embodiment 1

Figure 1:
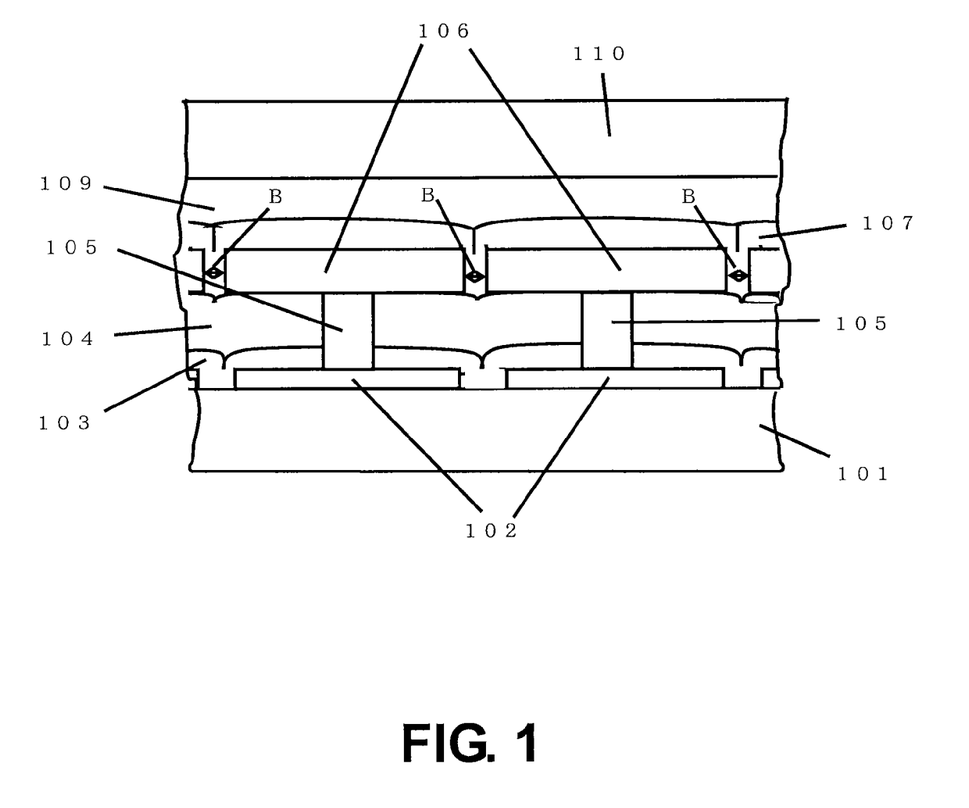
FIG. 1 is a schematic sectional view of a semiconductor integrated circuit device according to a first embodiment of the present invention.

Referring to FIG. 1, Embodiment 1 of the present invention is described. FIG. 1 is a schematic sectional view of a semiconductor integrated circuit device, in which an improvement is made of a structure of a metal interlayer insulating film having multi layer interconnects, thereby enhancing its reliability.

As illustrated in FIG. 1, fuse elements are formed on an element isolation insulating film 101 formed on a semiconductor substrate by the same conductive material with a gate electrode of a MOSFET, in other words, by polycide films 102 formed of a polycrystalline Si film and a WSix film doped with impurities. The polycide films 102 are covered with an interlayer insulating film 103 and a BPSG film 104, which being a flattering film. Contact holes 105 reaching to vicinities of both end portions of the polycide films 102 are opened within the BPSG film 104 and the interlayer insulating film 103. On the BPSG film 104, interconnects formed of an aluminum film 106 of a first layer are patterned so that the interconnects are brought into contact with the polycide films 102 through the contact hole 105. The aluminum films 106 are covered with a metal interlayer insulating film 107 of a first layer formed of TEOS as a raw material by plasma CVD. The surface of the metal interlayer insulating film 107 of the first layer is subjected to rotation coating, curing, and etchback of an SOG film. As a result, the surface of the metal interlayer insulating film 107 of the first layer is exposed without leaving the SOG films, thereby being a flattened state. A metal interlayer insulating film 109 of a second layer, which is made of TEOS as a raw material by plasma CVD is formed on the metal interlayer insulating film 107 of the first layer, and an aluminum film of a second layer is formed thereon (not shown). In addition, an SiN film 110 as a protective film is formed by plasma CVD so as to cover the aluminum film of the second layer and the metal interlayer insulating film 109 of the second layer. Then, opening regions for an aluminum pad and trimming processing are formed in the SiN film 110 as the protective film.

In this structure, a space width B between aluminum interconnects 106 to be connected to the adjacent fuse elements is set to less than two times of a thickness of a side wall of the metal interlayer insulating film 107 of the first layer, which is formed of TEOS as a material by plasma CVD. As a result, a shape between interconnects has a high aspect ratio, and hence there is no gap into which SOG film enters. Consequently, the SOG films are completely removed by the etchback process, which being a flattening technique during in-process, and the SOG films between the aluminum interconnects of the adjacent fuse elements are interrupted. Owing to this, water does not enter into the internal elements of the semiconductor integrated circuit device, thereby being capable of enhancing the reliability of the semiconductor integrated circuit device. It should be noted that regions, which are buried by the metal interlayer insulating film of the first layer in order to prevent the SOG from being exist within the spaces between the aluminum interconnects, are regions exposing to the inner surfaces of the opening regions for the trimming processing of the fuse elements, and hence the SOG may exist within the spaces between the aluminum interconnects if the regions do not expose to the inner surfaces of the opening regions.

Figure 2A:
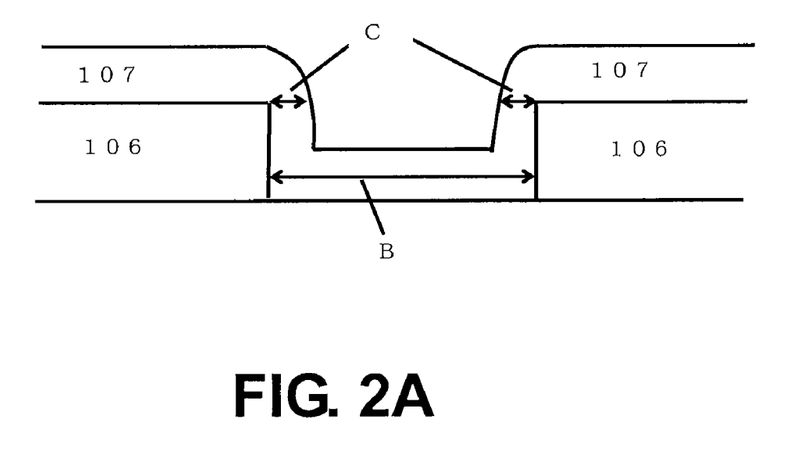
FIGS. 2A and 2B are supplementary diagrams according to the first embodiment of the present invention.

Here, description is made of a definition of the above-mentioned thickness of the side wall with reference to FIG. 2. FIG. 2 are supplementary diagrams of the first embodiment, in which FIG. 2A is a diagram, in a case where the space width B between the aluminum interconnects 106 of the first layer is wider, for illustrating a state after deposition of the metal interlayer insulating film of the first layer. If the metal interlayer insulating film of the first layer 107 is deposited by CVD on the aluminum interconnects 106, the metal interlayer insulating film of the first layer 107 adhere on top and side surfaces of the aluminum interconnects 106. Here, the metal interlayer insulating film of the first layer is formed into an $SiO_2$ film. In this case, the film thickness of the $SiO_2$ film on the top surface of the aluminum interconnects differs from the film thickness of the side surface thereof, and there is a tendency that the film thickness of side surface generally becomes thinner than the film thickness of the top surface. Further, as illustrated in the figure, the film thickness of the $SiO_2$ film of the side surface of the aluminum interconnect 106 varies depending on its vertical position. The above-mentioned thickness of the side wall is the film thickness of the side surface of the $SiO_2$ film at the same height position of the top surface of the aluminum interconnects 106, and is represented by a symbol C of the figure.

Figure 2B:
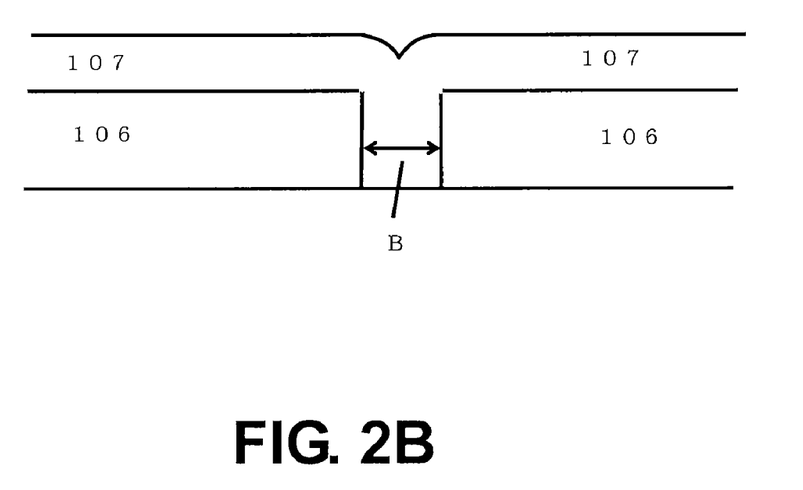

As illustrate in FIG. 2B, if the space width B between the aluminum interconnects 106 is set as narrower so as to be less than two times of the thickness of the side wall of the metal interlayer insulating film of the first layer 107, the space between the interconnects is buried by the $SiO_2$ film is. As a result, it becomes impossible for the SOG films to be coated later to enter into the space between the aluminum interconnects 106. After the coating and curing of the SOG films, the etch-back is carried out so as to remove the SOG films exist in the above of the space between the aluminum interconnects 106, thereby being capable of obtaining satisfactory flatness.

In the semiconductor integrated circuit device of the present invention formed as described above, there is no hygroscopic SOG film in the space between the aluminum interconnects, and hence the entry of water into the internal element from the opening region may be prevented, thereby being capable of enhancing the reliability of the semiconductor integrated circuit.

Embodiment 2

Figure 3:
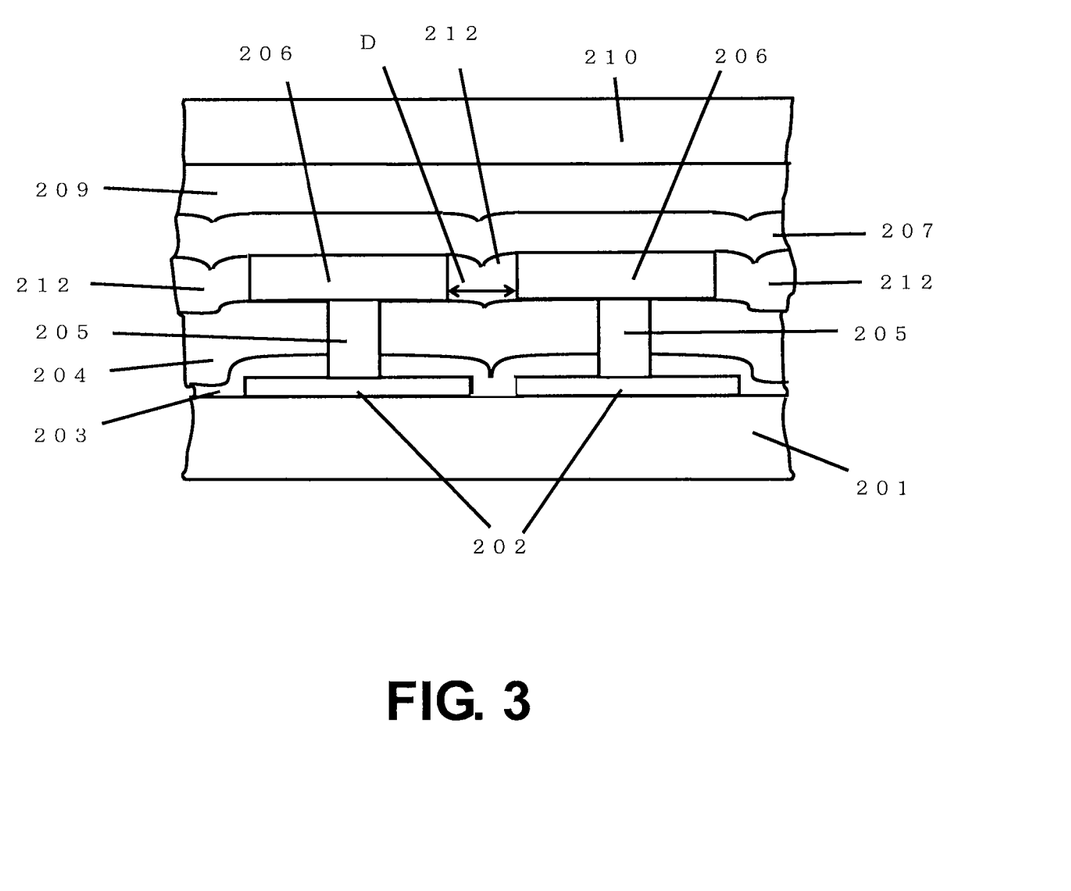
FIG. 3 is a schematic sectional view of a semiconductor integrated circuit device according to a second embodiment of the present invention.

Next, referring to FIG. 3, Embodiment 2 of the present invention is described. FIG. 3 is, as in FIG. 1, a schematic sectional view of a semiconductor integrated circuit device of the present invention, in which an improvement is made of a structure of a metal interlayer insulating film having multi layer interconnects, thereby enhancing its reliability.

In Embodiment 2, interconnects made of an aluminum film 206 of a first layer are subjected to patterning on the BPSG film 204 so that the interconnects are brought into contact with polycide film 202, and then the interconnects are covered with an $SiO_2$ film made of TEOS as a material by plasma CVD or a phosphor silica glass (PSG) film, or an SiN film. After that, through carrying out etch-back using as an etch stopper aluminum films 206, side spacers 212 are formed at ends of the aluminum interconnects. Next, a metal interlayer insulating film 207 is formed so as to cover the aluminum films 206, the side spacers 212, and the BPSG films 204. Then, the surface of the metal interlayer insulating film 207 of the first layer is subjected to rotation coating, curing, and etch-back of an SOG film. However, the surface of the metal interlayer insulating film 207 of the first layer is exposed without leaving the SOG films, thereby being a flattened state. A metal interlayer insulating film 209 of a second layer, which is made of TEOS as a raw material by plasma CVD is formed on the metal interlayer insulating film 207 of the first layer, and an aluminum film of a second layer is formed thereon (not shown). In addition, an SiN film 210 as a protective film is formed by plasma CVD so as to cover the aluminum film of the second layer and the metal interlayer insulating film 209 of the second layer. Then, opening regions for an aluminum pad and trimming processing are formed in the SiN film 210 as the protective film.

In this structure, a space width D between aluminum interconnects 206 to be connected to the adjacent fuse elements is set to less than two times of a thickness of a side wall of the metal interlayer insulating film 207 of the first layer, which is formed of TEOS as a material by plasma CVD. As a result, a shape between interconnects has a high aspect ratio, and hence there is no gap into which SOG film enters. Consequently, the SOG films are completely removed by the etch-back process, which being a flattening technique during in-process, and the SOG films between the aluminum interconnects of the adjacent fuse elements are interrupted. Owing to this, water does not enter into the internal elements of the semiconductor integrated circuit device, thereby being capable of enhancing the reliability of the semiconductor integrated circuit device. It should be noted that regions, which are buried by the metal interlayer insulating film of the first layer in order to prevent the SOG from being exist within the spaces between the aluminum interconnects, are regions exposing to the inner surfaces of the opening regions for the trimming processing of the fuse elements, and hence the SOG may exist within the spaces between the aluminum interconnects if the regions do not expose to the inner surfaces of the opening regions.

Figure 4:
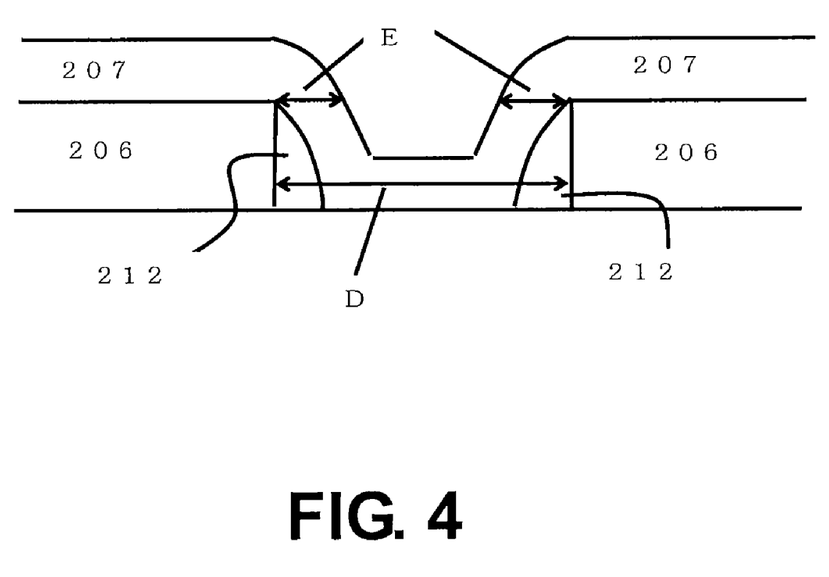
FIG. 4 is a supplementary diagram according to the second embodiment of the present invention.

Here, supplemental description is made of Embodiment 2 by using FIG. 4. FIG. 4 is a supplementary diagram of Embodiment 2, and is a diagram after the deposition of the metal interlayer insulating film of the first layer in a case where a space width D between the aluminum interconnects 206 of the first layer is wider. At the side surface of the aluminum interconnects 206 of the first layer, the side spacers 212 are formed, and the metal interlayer insulating film of the first layer 207 is deposited so as to cover the side spacers 212 and the aluminum interconnects 206 of the first layer. The thickness E of the side wall of the metal interlayer insulating film of the first layer becomes larger than the thickness C of the side wall of the metal interlayer insulating film of the first layer as illustrated in FIG. 2A. This is because that the side spacers 212 are under-laid.

Through employment of the above-mentioned structure, the space width between the aluminum interconnects of the first layer may be made wider compared to the semiconductor integrated circuit device of Embodiment 1. In addition, there occurs no fear of generating minute voids within the metal interlayer insulating film of the first layer buried between the spaces between the aluminum interconnects of the first layer, thereby being capable of providing the semiconductor integrated circuit device having a higher reliability.

What is claimed is:
1. A semiconductor integrated circuit device, comprising:
an element isolation insulating film disposed on a semiconductor substrate;
fuse elements disposed on the element isolation insulating film;
an insulating film disposed on the fuse elements;
first interconnects connected to the fuse elements via contact holes in the insulating film, the first interconnects having a sidewall surface and an upper surface; and
a first metal interlayer insulating film overlying the sidewall surface and the upper surface of the first interconnects, and an SOG film and a second metal interlayer insulating film overlying the first metal interlayer insulating film and the first interconnects;
wherein a space width between the first interconnects connected to adjacent ones of the fuse elements is less than twice a thickness of the first metal interlayer insulating film overlying the sidewall of the first interconnects.

2. A semiconductor integrated circuit device according to claim 1, further comprising side spacers provided on the sidewall surfaces of the first interconnect, wherein the first metal interlayer insulating film covers the first interconnect and the side spacers.

3. A semiconductor integrated circuit device according to claim 2, wherein the side spacers comprise a material selected from the group consisting of: an oxide silicon film; a phosphor silica glass (PSG) film; and a nitride silicon film.

* * * * *